(12) United States Patent
Whitaker et al.

(10) Patent No.: US 11,552,079 B2
(45) Date of Patent: Jan. 10, 2023

(54) SELF RESTORING LOGIC STRUCTURES

(71) Applicant: ICs LLC, McCall, ID (US)

(72) Inventors: Sterling Whitaker, Albuquerque, NM (US); Gary Maki, Ponte Vedra, FL (US)

(73) Assignee: ICs LLC, McCall, ID (US)

( * ) Notice: Subject to any disclaimer, the term of this patent is extended or adjusted under 35 U.S.C. 154(b) by 77 days.

(21) Appl. No.: 17/321,070

(22) Filed: May 14, 2021

(65) Prior Publication Data
US 2021/0272953 A1 Sep. 2, 2021

Related U.S. Application Data

(62) Division of application No. 16/583,820, filed on Sep. 26, 2019, now Pat. No. 11,069,683.
(Continued)

(51) Int. Cl.
*H01L 27/092* (2006.01)
*H01L 21/8238* (2006.01)

(52) U.S. Cl.
CPC .... *H01L 27/092* (2013.01); *H01L 21/823807* (2013.01); *H01L 21/823814* (2013.01); *H01L 21/823842* (2013.01)

(58) Field of Classification Search
CPC ........... H01L 27/092; H01L 21/823807; H01L 21/823814; H01L 21/823842
(Continued)

(56) References Cited

U.S. PATENT DOCUMENTS 4,541,067 A 9/1985 Whitaker
4,566,064 A 1/1986 Whitaker
(Continued)

FOREIGN PATENT DOCUMENTS

JP 20090028638 A 7/2009

OTHER PUBLICATIONS

"Internal State Assignments for Asynchronous Sequential Machines", IEEE Transactions on Electronic Computers, vol. EC-15, pp. 551-560, Aug. 1996.
(Continued)

*Primary Examiner* — Dzung Tran
(74) *Attorney, Agent, or Firm* — Haverstock & Owens, A Law Corporation

(57) ABSTRACT

A SEU tolerant structure has two logic sections that generate two output signals that are complementary such that a fault which affects one section cannot affect the other section. Adjacent NMOS regions or adjacent PMOS regions contain no logic inversions in the combinational logic or if logic inversions in the combinational logic are present where all gates following the inversion are SEU hard by design. The circuits can be realized using one of a Complex CMOS gate, pass transistor logic, Multiplexor logic, AND-OR logic or OR-AND logic. A SRL latch is formed of three NMOS and PMOS structures having a first latch with a first NMOS structure adjacent a first PMOS structure, a second latch with a second NMOS structure adjacent a second PMOS structure wherein the first and second NMOS structures are adjacent one another, and a third latch with a third NMOS structure adjacent a third PMOS structure wherein the second and third PMOS structures are adjacent one another, wherein the latch is adapted to have alternating logic with a state assignment of 010 and 101. A Single Event Upset Triple Modular Redundancy (TMR) tolerant circuit generates complementary output values 010 and 101 with layouts that are adjacent.

5 Claims, 15 Drawing Sheets

Related U.S. Application Data

(60) Provisional application No. 62/741,926, filed on Oct. 5, 2018.

(58) Field of Classification Search
USPC ........................................................ 257/369
See application file for complete search history.

(56) References Cited

U.S. PATENT DOCUMENTS

| | | | |
|---|---|---|---|
| 4,622,648 | A | 11/1986 | Whitaker |
| 6,573,773 | B2 | 6/2003 | Maki |
| 6,937,053 | B2 | 8/2005 | Carlson |
| 2004/0078653 | A1* | 4/2004 | Chan .................. G06F 11/2038 714/13 |
| 2004/0130351 | A1 | 7/2004 | Hazucha et al. |
| 2006/0033523 | A1 | 2/2006 | Erstad |
| 2007/0109865 | A1 | 3/2007 | Maki et al. |
| 2009/0189634 | A1 | 7/2009 | Rezgui |
| 2010/0026338 | A1 | 2/2010 | Fulcomer |
| 2010/0301446 | A1 | 12/2010 | Cannon et al. |
| 2018/0109749 | A1 | 4/2018 | Boemler |

OTHER PUBLICATIONS

L.R. Rockett, Jr., "An SEU hardened CMOS data launch design", IEEE Trans. Nucl. Sci., vol. 35, pp. 1682-1687, Dec. 1988.
M.N. Liu, S. Whitaker, "Low power SEU immune CMOS memory circuits", IEEE Trans. Nucl. Sci., vol. 39, pp. 1679-1684, Dec. 1992.
J. Gambles, G. Maki and S. Whitaker, "Radiation Hardening by Design", International Journal of Electronics, vol. 95, No. 1, pp. 11-26, Jan. 2008.Radhakrishnan, S. Whitaker and G. Maki, "Formal Design Procedures for Pass Transistor Switching Circuits," IEEE.
Radhakrishnan, S. Whitaker and G. Maki, "Formal Design Procedures for Pass Transistor Switching Circuits", IEEE Journal of Solid State Circuits, pp. 531-536, Apr. 1985.

* cited by examiner

SERT Latch $Y_0 = y_1y_3(0) + y_1'(1)$ $Y1 = y0y2(0) + y2'(1)$ $Y2 = y1y3(0) + y3'(1)$ $Y3 = y0y2(0) + y0'(1)$ State Transition Table

| y2 y3 \ y0 y1 | 00 | 01 | 11 | 10 |
|---|---|---|---|---|
| 00 | 1111 | Z111 | Z11Z | 111Z |
| 01 | 11Z1 | 0101 | 010Z | 11ZZ |
| 11 | 1ZZ1 | 0Z01 |  | 10Z0 |
| 10 | 1Z11 | ZZ11 | Z010 | 1010 |

Fig. 2 (Prior Art)

| y3 \ y1 y2 | 00 | 01 | 11 | 10 |
|---|---|---|---|---|
| 0 | 1 | 1 | 0 | 1 |
| 1 | 0 | 0 | 0 | 1 |

Fig. 15

| y3 \ y1 y2 | 00 | 01 | 11 | 10 |
|---|---|---|---|---|
| 0 | 1 | 1 | 0 | 1 |
| 1 | 0 | 0 | 0 | 1 |

| y3 \ y1 y2 | 00 | 01 | 11 | 10 |
|---|---|---|---|---|
| 0 | 0 | 0 | 1 | 0 |
| 1 | 1 | 1 | 1 | 0 |

| y3 \ y1 y2 | 00 | 01 | 11 | 10 |
|---|---|---|---|---|
| 0 | 1 | 1 | 0 | 1 |
| 1 | 0 | 0 | 0 | 1 |

| y3 \ y1 y2 | 00 | 01 | 11 | 10 |
|---|---|---|---|---|
| 0 | 0 | 0 | 1 | 0 |
| 1 | 1 | 1 | 1 | 0 |

Complex CMOS realization of F and F'

SELF RESTORING LOGIC STRUCTURES

RELATED APPLICATIONS

This application is a divisional application of co-pending U.S. patent application Ser. No. 16/583,820, filed on Sep. 26, 2019, which in turn claims priority of U.S. Provisional Patent Application Ser. No. 62/741,926, filed Oct. 5, 2018, and both entitled "Self Restoring Logic Structures", which are hereby incorporated in their entirety by reference.

FIELD OF THE INVENTION

The present invention relates to fault tolerant circuits. More particularly, the present invention relates to fault tolerant circuits that utilize Self Restoring Logic (SRL) and Structures. There are two major problems facing fault tolerant circuit designers: high speed operation and high density layout. SRL as described in U.S. Pat. No. 8,081,010 presented one solution to the high speed problem; the present invention provides a solution to the high density problem. U.S. Pat. No. 8,081,010 is invented at least in part by one of the inventors of the present application, and is hereby incorporated in its entirety by reference.

BACKGROUND OF THE INVENTION

There is a growing need for fault tolerant circuits as integrated circuit (IC) process feature sizes become smaller. Smaller transistor feature sizes carry the advantages of higher speed, lower power and greater density; however they exhibit reduced tolerance to Single Event Upsets (SEUs) due to radiation and possibly other noise sources; this is becoming a more serious problem with modern electronics. Radiation can have detrimental effects on modem electronics, including immediate temporary information upset and increased power consumption as a circuit responds to a SEU. Ionizing radiation occurs in the form of charged particles that possess enough energy to break atomic bonds and create electron/hole pairs in the absorbing material. Such particles can include protons, electrons, atomic ions, and photons with energies greater than the material band gaps. The primary ionizing radiation effects on microelectronics can be categorized as either total ionizing dose (TID) effects or transient effects. TID effects are a function of ionizing radiation accumulation over months or even years, which can lead to performance degradation due to transistor threshold shifts and eventually to functional failure.

The SEU occurs when the charge collected as a result of the generated photo currents is of sufficient magnitude to alter the logic state of a susceptible node. There are space as well as terrestrial SEU sources making this problem important both in space and on the earth. An upset node can further cause the alteration of the contents of circuit memory elements or alter the operation of the circuit in such a way as to cause an error in a logic function. The SEU problem is especially pronounced in space electronics and to a lesser degree in aircraft electronics and to an even lesser degree on the surface of the earth. As IC process feature sizes continue to decrease, it is possible that terrestrial electronic problems will become more evident, especially in real time control electronics such as autonomous vehicles or electrical power distribution systems.

In general, Legacy Radiation Hard By Design (RHBD) electronic technologies are acceptable for feature sizes greater than 200 nm. This RHBD technology has focused mostly on layout issues which partition critical node transistors within latch cells to minimize multiple node SEU effects. However, these same technologies are ineffective at the sub 100 nm process nodes. Linear energy transfer (LET) is a measure of the energy transferred to material as an ionizing particle travels through. Typically, this measure is used to quantify the effects of ionizing radiation on electronic devices. NASA determines that an LET around 40 MeV-cm2/mg is acceptable for flight electronics to be essentially immune to single event upsets. LET values in legacy SEU tolerant electronics have been reported to be near 5 MeV-cm2/mg with onset values near 0.5 MeV-cm2/mg, indicating that legacy technologies are inefficient in modern processes especially for high speed circuits.

Many of the problems demonstrated with legacy SEU tolerant designs were solved with the advent of Self Restoring Logic (SRL) and described in U.S. Pat. No. 8,081,010. LET values for SRL electronics has been reported to exceed 100 MeV-cm2/mg at test frequencies as high as 700 MHz. SRL has great promise in solving the SEU problem, not only for space applications but terrestrial applications such as autonomous vehicles because fully advantage of the process speed can be exploited. Legacy SEU tolerant designs are limited to speeds less than 150 MHz.

Transistor spacing is a serious issue with both legacy and SRL SEU tolerant designs. Each SEU technology has redundant logic (nodes), often 3, which store redundant data. It is critical that a single SEU does not impact two or more critical nodes. This feature is insured by determining a minimum distance where critical nodes can be placed. The SEU minimum distance is determined by testing at a radiation facility. For processes which are relatively large such as 250 nm or greater, the SEU minimum distance is not as critical an element since the process layout rules require spacing on this order. However, SEU minimum distance becomes the dominant dimension in the layout structures within processes with small feature size, for example a 22 nm process.

Prior to SRL there was another problem that had gone unnoticed. Legacy RHBD electronics are limited to speeds less than 200 MHz, regardless of transistor spacing. The fact which determines the final circuit speed is based on the radiation recovery nature of legacy SEU radiation tolerant latches and the data flow between the latches through combinational logic. For example, when a conventional RHBD cell is upset, it is held in a transition state until the deposited charge responsible for the SEU dissipates, which can take on the order of a 1 ns. After dissipation, a feedback network activates to force the circuit into a stable state. More than 1 ns may be required for the SEU dissipation and circuit feedback to restore the circuit to the correct state.

The essential building block of a RHBD circuit is a radiation tolerant storage element, or cell. Conventional RHBD storage electronics tolerate an SEU impact through a cell recovery process where the cell state is restored to the correct value through a network of feedback signals. Such circuits are formally known as asynchronous sequential circuits. Conventional RHBD technology has essentially ignored operational speed and cell recovery because the speed afforded by older fabrication processes is slower than the SEU particle dissipation and circuit recovery time. For example, a 1 ns SEU recovery time is within delay times associated with elements of a 250 nm circuit design. As a result, designs can essentially wait for the particle effect to dissipate and not suffer a large speed impact. However, a 1 ns delay greatly impacts the operating speeds in modern sub 100 nm processes.

A conventional RHBD SEU tolerant storage cell is achieved through redundancy. Many different cell designs are currently in use, including a SERT cell, a DICE cell, and a Dooley-Berry cell. The SERT cell has advantages over the DICE cell. For example in a SERT cell, no conflicts between PMOS pull down and NMOS pull up circuits can occur during an SEU. Further, good radiation results have been reported with the SERT cell being used in numerous chip designs.

Logic circuits without memory elements such as latches or flip-flops are known as combinational circuits. Typical combinational logic circuits are realized with NAND-NAND logic. Alternative combinational logic can also be realized with Pass Transistor Logic invented by one of the present inventors. Pass Transistor networks are known to produce high density with fewer transistors than traditional NAND-NAND realizations. For example, using Pass Transistor Logic the logic circuit shown in FIG. 15 can be realized with two transistors; in this case F=X'(Z')+X(Y) assuming each variable and it's complement are available. F is realized with an NMOS transistor with Z' being passed and another NMOS transistor when X=0 and variable Y passed when X=1. A conventional NAND-NAND circuit would require 12 transistors.

The operation of the prior art SERT cell, the DICE cell, and the Dooley-Barry cell are described herein to demonstrate problems with SEU events in speed applications. FIG. 1 illustrates a schematic diagram of an exemplary SERT cell. The SERT cell, or SERT latch cell, is modeled as an asynchronous sequential circuit with two stable states shown shaded in FIG. 2. A stable state is a state does not transition unless an external event occurs. An unstable state transitions to a different state due to internal feedback. An asynchronous sequential circuit is a finite state machine which provides an output based on the current inputs and past inputs. In other words, such circuits have memory. Memory is achieved through feedback signals known as internal state variables typically depicted with a symbol yi. An asynchronous sequential circuit can be completely defined in terms of a state table. In the example SERT cell shown in FIG. 1, there are four output terminals, or nodes, Y0, Y1, Y2, Y3, and there are four feedbacks from these nodes, which are referred to as y0, y1, y2, y3. Each of Y0, Y1, Y2 and Y3 are formed of two NMOS transistors coupled to VDD and one PMOS transistor coupled to VSS, all with their channels in series. Other enablements are possible.

An analysis of the SERT cell is illustrated in a state transition table shown in FIG. 2. The inputs for each of the feedbacks y0 and y1 are shown on the horizontal line above the chart. The inputs for each of the feedbacks y2 and y3 are shown in the vertical line to the left of the chart. The resulting state, or next state, for each of the four nodes Y0, Y1, Y2 and Y3, are shown in each corresponding box in the chart. The variables Y0, Y1, Y2, and Y3 can assume binary values (0 and 1). An entry of Z in the chart represents a high impedance condition (i.e. nondriven condition). The stable states (normal operation state) are 0101 and 1010 because at these internal states the SERT cell retains its state at the output nodes. In normal operation, the circuit transitions between these two states.

The next state equations for the SERT cell are defined by:

$$Y0 = y1y3(0) + y1'$$

$$Y1 = y0y2(0) + y2'(1)$$

$$Y2 = y1y3(0) + y3'(1)$$

$$Y3 = y0y2(0) + y0'(1) \quad (1)$$

As can be seen in the circuit of FIG. 1, the gate of the lower NMOS transistor of Y3 is coupled to be driven by Y2, the gate of the upper NMOS transistor of Y3 is coupled to driven by Y0 and the gate of the PMOS transistor is coupled to be driven by Y0 (and thus its complement). These couplings correspond to the equation for Y3 shown above.

The next state variables are noted as Yi and the present state variables, also referred to as the internal state variables, are noted as yi, as per standard asynchronous sequential circuit terminology. The next state defines the state the circuit will assume and are defined in terms of next state variables. In the case of the SERT cell shown in FIG. 1, the next state variables correspond to the nodes Y0, Y1, Y2, Y3 and the present state variables correspond to the feedback variables y0, y1, y2, y3. A variable can assume binary values (0 and 1) and as logic variables can be represented as uncomplemented or complemented variables. A complemented variable, such as y1' is the inverse of the variable yi. If yi=1, then yi'=0, and vice versa. In general, a pass logic expression Y=A(0)+B(1) means that when A is 1 then a 0 is passed to Y; if B=1, a 1 is passed to Y. As applied to the next state equation (1), the first term on the right hand side of the first equation, y1y3(0), indicates the conditions that will cause Y0 to be driven to the 0 state. In this case Y0 is driven to 0 when both y1 and y3 are high, which corresponds to turning on the two NMOS transistors below node Y0 in FIG. 1 since a NMOS transistor turns on when the gate signal is a logic 1. The second term on the right hand side of the first equation, y1'(1), indicates the conditions that will cause Y0 to be driven to the 1 state. In this case Y0 is driven to 1 when y1 is low, which corresponds to turning on the PMOS transistor above the node Y0 in FIG. 1 since a PMOS transistor turns on when the gate signal is a logic 0. It is impossible to drive Y0 to the 1 and 0 states simultaneously, so node Y0 is free of conflicts. However, if y1 is high and y3 is low then Y0 is not driven and is left in a high impedance state, holding its previous logic level by virtue of the capacitance on this node. The remaining next state equations (1) are similarly interpreted.

Referring to FIG. 2, the shaded entries denote the stable states. Response to an SEU can be determined from the state transition table. For example, suppose the circuit is in state 0101 and an SEU affects state variable Y2 forcing this node to transition from a 0 to 1 (upset the PMOS device above node Y2). As a result, the circuit enters state 0111 which corresponds to a next state entry of 0Z01, as shown in FIG. 2. In response, the next state action of the circuit drives only Y2 back to a 0, leaving all other state variables at the same value, such that as soon as the SEU event dissipates, the circuit returns to the state 0101, illustrating correct SEU tolerant action. Detailed transition discussions and background information are described in the paper titled "Radiation Hardening by Design" by Gambles et al.

It is possible for the SERT cell to enter numerous states as a result of an SEU. For example, if the SERT cell is in state 0101 and an error occurs on Y3 (state transitions from 1 to 0), this forces the SERT cell to state 0100. As shown in FIG. 2, the state 0100 has a next state entry Z111. With a present state y0=0 and next state=Z, no state change on Y0 is being forced, hence y0 will remain 0. Y1 and y1 are both 1, so there is no change in y1 which will remain 1. With y2=0 and Y2=1, y2 will assume 1. Since Y3 is upset to a 1 from the present state y3=0 by the SEU (assuming the electronics is faster than the time for the SEU to dissipate). Accordingly, with the next state entry Z111, the next state will be 0110.

The state 0110 has a next state entry of ZZ11. The SERT cell remains in next state 0110 until the SEU dissipates (state of Y3 returns to 1) after which the SERT cell transitions to state 0111 and then immediately returns to stable state 0101. The recovery time from an SEU requires three circuit transitions, the transition from the state 0100 after the initial SEU event to the next state 0110, the transition from the next state 0110 to the state 0111 after the SEU dissipates, and the transition from the state 0111 to the stable state 0101. The recovery time is determined by the switching time of the electronics and the time for the SEU to dissipate.

Self Restoring Logic

The traditional manner to provide SEU fault tolerance is through the use of Triple Modular Redundancy (TMR) as depicted in FIG. 3. SRL provides a superior means due to internal recovery for SEU tolerance; SRL is depicted in FIG. 4. SRL details are described in U.S. Pat. No. 8,081,010.

Embodiments of the present application are directed to a fault tolerant circuit. Those of ordinary skill in the art will realize that the following detailed description of the fault tolerant circuit is illustrative only and is not intended to be in any way limiting. Other embodiments of the fault tolerant circuit will readily suggest themselves to such skilled persons having the benefit of this disclosure.

FIG. 5 illustrates a functional block diagram of a data storage cell, or latch. In this embodiment, the data storage cell includes three state variable modules. Each state variable module implements a state variable in the defining state transition table. In this embodiment, the stable states are 000 and 111, as shown in the state transition table of FIG. 6.

The design equations for Design 1 are:

$Y1 = y2y3(0) + y2'y3'(1)$ $Y2 = y1y3(0) + y1'y3'(1)$ $Y3 = y1y2(0) + y1'y2'(1).$

In other embodiments, the stable states are 010 and 101, as shown in the state transition table of FIG. 7. The data storage cell using TMR shown in FIG. 8 has three state variable modules. Moreover, there is one output per state variable module. In some embodiments, each state variable module includes two PMOS transistors and two NMOS transistors along with an inverter as depicted in FIG. 8; the inverter may or may not be needed in all state variable modules.

The design equations for Design 2 are:

$Y1 = y2y3'(0) + y2'y3(1)$ $Y2 = y1y3(0) + y1'y3'(1)$ $Y3 = y1'y2(0) + y1y2'(1)$

Upon an occurrence of an SEU or transient fault, the data storage cell performs self-restoration to the circuit state before the fault. Internal state variable feedback between the state variable modules performs the following action. In normal operation when no fault is present, each state Yi is driven to remain in a stable state, such as the stable states Y0Y1Y2 =000 and 111 for the circuit of FIG. 5, or Y0Y1Y2=010 or 101 for the circuit of FIG. 8. For example, upon the presence of a fault in Y1, the feedback is such that Y1 is energized to return to the correct value. In addition, the feedback places Y2 and Y3 into a condition where Y2 and Y3 cannot change state. This is accomplished by putting both Y2 and Y3 in a high impedance condition during the upset event so they cannot transition further. When the fault dissipates, Y1 being energized to return to the correct value which in turn will cause Y2 and Y3 to exit the high impedance state. The circuit tolerates the fault, self restores and at most only one state variable produces a faulty state while the SEU is present. Such performance is seen in the state transition tables of FIGS. 6 and 7.

The physical embodiment of the Combinational Logic (CL) and SRL latch as depicted in FIG. 4 is depicted in more detail in FIG. 9 where separate CL blocks drive each of the state variables Y1 Y2 Y3 in the SRL latch. Three separate CL blocks are needed such that a single SEU cannot affect more than one state variable. With current technology, the layout for each Yi and CLi, i={1,2,3} is separated by a distance such that only one CLi or Yi can be affected by a single SEU.

An understanding of SEU impact on NMOS transistors and PMOS transistors is important for the understanding of this invention. An SEU will cause an NMOS structure to only produce a false 0, never a false 1. Therefore, if an output of logic 1 is being presented by an NMOS structure, it is fault free; if an output of 0 is presented by an NMOS structure, it can be fault free or the result of an SEU fault. Similarly, a PMOS structure will only produce a false 1, never a false 0. This is an important notion in structuring an efficient layout.

SUMMARY OF THE INVENTION

A logic structure includes both NMOS and PMOS devices that generate a pair of signals Z1 and Z2 which are logical complements. Both signals cannot simultaneously fail if a single transient unidirectional fault strike the NMOS or PMOS sections of both logic structures. A unidirectional fault is one which drives a circuit to either a 1 or 0 value, but not both a 1 and a 0. A unidirectional fault cannot drive an NMOS circuit for example to a false 1 at one time and a false 0 at another time. The structure is designed under the following conditions.

a. Alternating logic is used with complementary outputs Z1=F and Z2=F';
b. Combinational logic with adjacent NMOS (or PMOS) regions of logic functions F and G
  i. F=G' and F and G contain no logic inversions in the combinational logic or
  ii. The conditions of (i) are true except there are logic inversion gates all of which are SEU hard by design.

A logic structure includes both NMOS and PMOS devices that generate a pair of signals Z1 and Z2 which are logical complements. Both signals cannot simultaneously fail for single SEU faults. The structure is designed under the following conditions.

a. Alternating logic is used with complementary outputs Z1=F and Z2=F';
b. Combinational logic with adjacent NMOS (or PMOS) regions of logic functions F and G
  i. F=G' and F and G contain no logic inversions in the combinational logic or
  ii. The conditions of (i) are true except there are logic inversion gates all of which are SEU hard by design. F and G can be selectively realized with a Complex CMOS gate, pass transistor logic, Multiplexor logic, AND-OR logic or OR-AND logic without SEU hardened logic.

A Self Restoring Logic (SRL) layout of the SRL latch is realized with alternating logic with a state assignment of 010 and 101 (FIG. 8). PMOS or NMOS regions can abut as to alternately share VDD and VSS regions.

A Single Event Upset tolerant design structure for general logic circuits generates F and F' values from layouts that are adjacent. Adjacent combinational logic circuits generate state assignments of 010 and 101. The PMOS or NMOS regions of separate signals are adjacent. The combinational logic circuits utilize different logic circuit realizations such as a Complex CMOS Gate is utilized where a single SEU cannot cause any two adjacent layouts to produce false values for both F & F'; for example if the correct values for F F'=0 1, than a single SEU cannot produce output F F'=1 0. Memory cells (latches, flip-flops) are self restoring and correct single error inputs. The Memory cell are SRL latches with state assignment 010 and 101.

A Single Event Upset Triple Modular Redundancy (TMR) tolerant circuit that generates F and F' values from layouts that are adjacent. PMOS or NMOS regions of separate signals are adjacent. Combinational logic circuits utilize different logic circuit realizations such as a Complex CMOS Gate is utilized where a single SEU cannot cause any two adjacent layouts to produce false values for both F & F'; for example if the correct values for F F'=0 1, than a single SEU cannot produce output F F'=1 0. Voting provides self restoring functions to internal latches or flip-flops.

BRIEF DESCRIPTION OF THE DRAWINGS

FIG. 2 shows a State Table for the SERT circuit of FIG. 1.

FIG. 15 shows a simple 3-variable Karnaugh Map for function F.

FIG. 16 shows a K-Map for a minimal sum-of-products solution for the K-Map of FIG. 15.

FIG. 17 shows a K-Map which is the complement of FIG. 15.

FIG. 18 shows a K-Map and Complex CMOS Gate design equation for function F.

FIG. 19 shows a K-Map and Complex CMOS design equation for function F'

DESCRIPTION OF THE EMBODIMENTS

Figure 1:
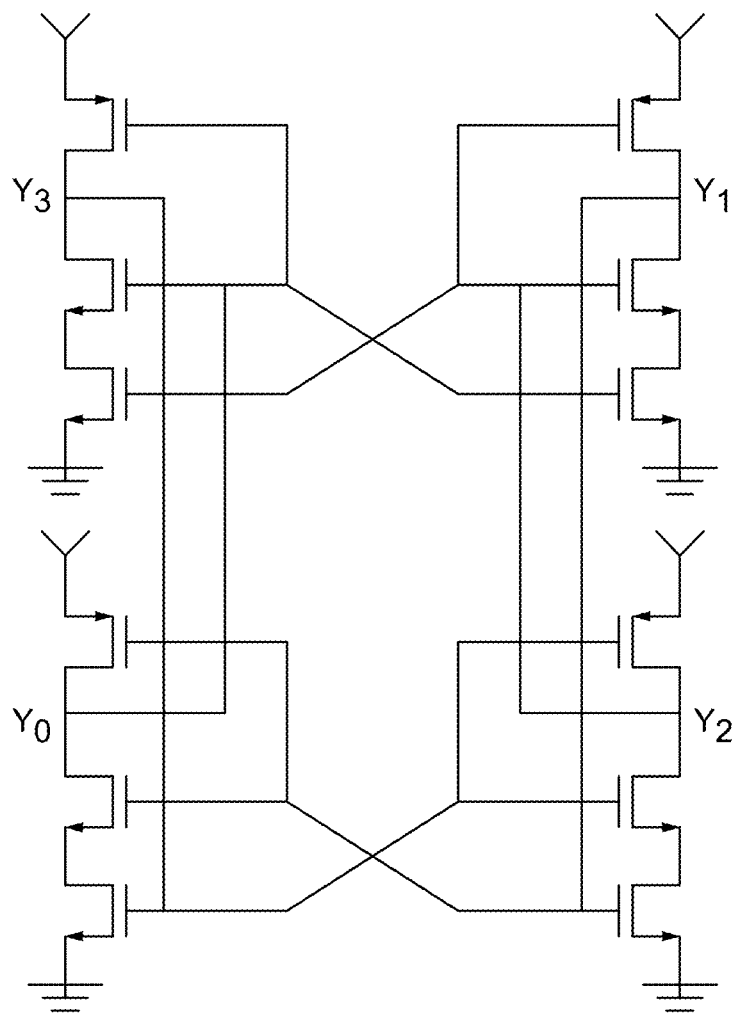
FIG. 1 shows a SERT Latch Circuit of the prior art.
Figure 3:
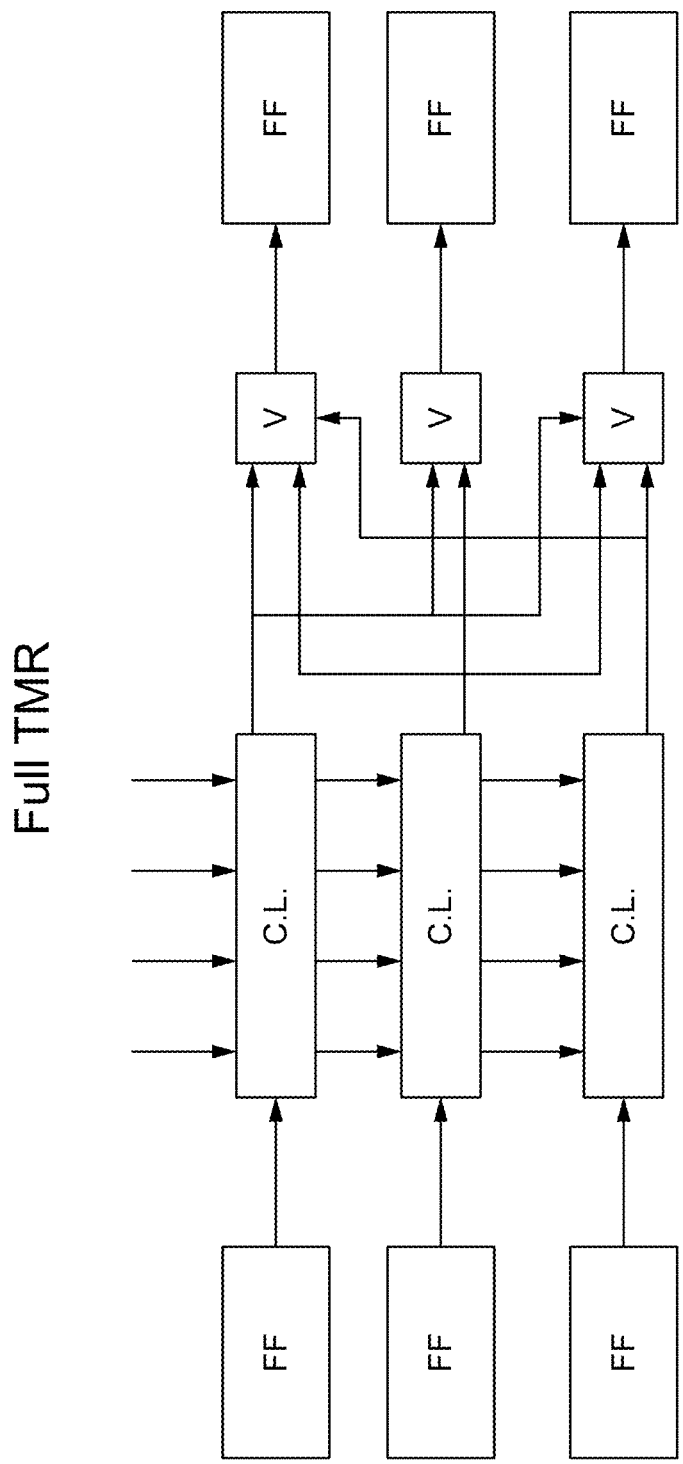
FIG. 3 shows a schematic representing Triple Modular Redundancy of the prior art.
Figure 4:
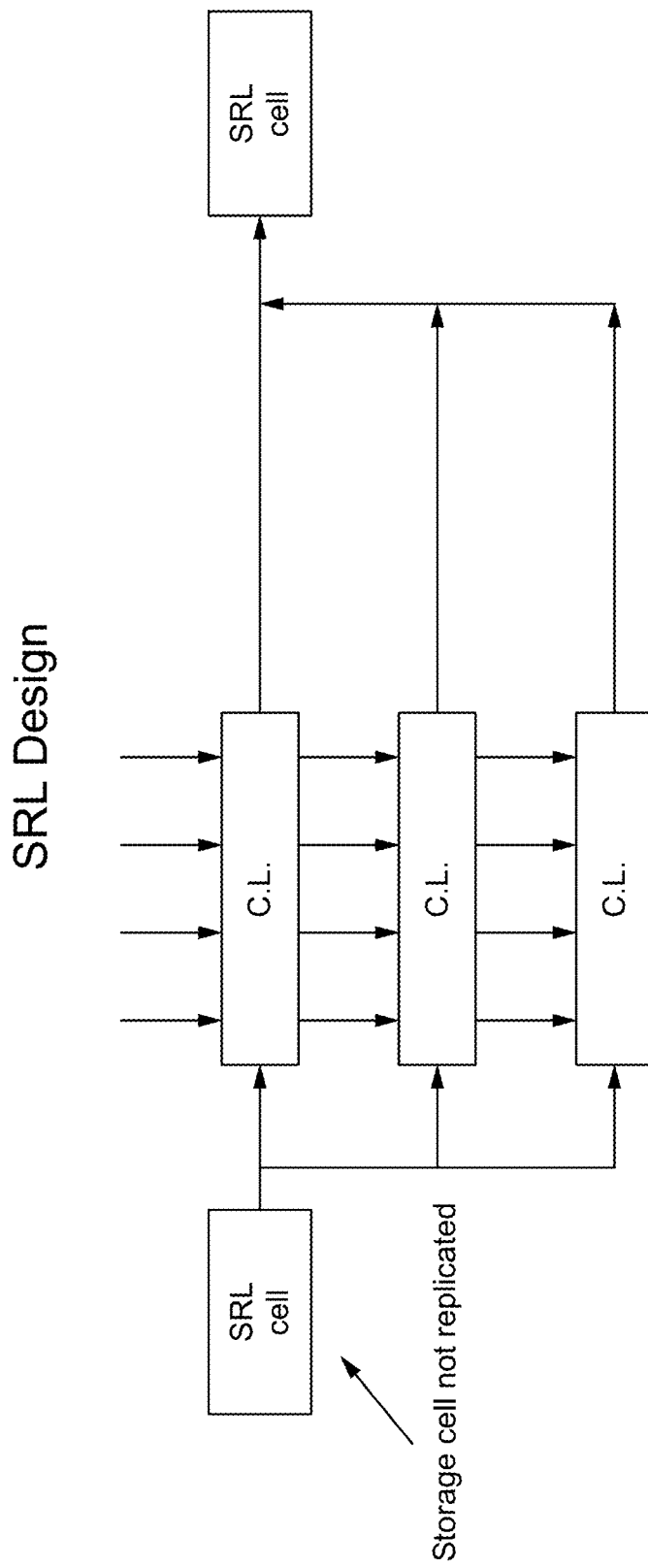
FIG. 4 shows a schematic representing SRL Design of the prior art.
Figure 5:
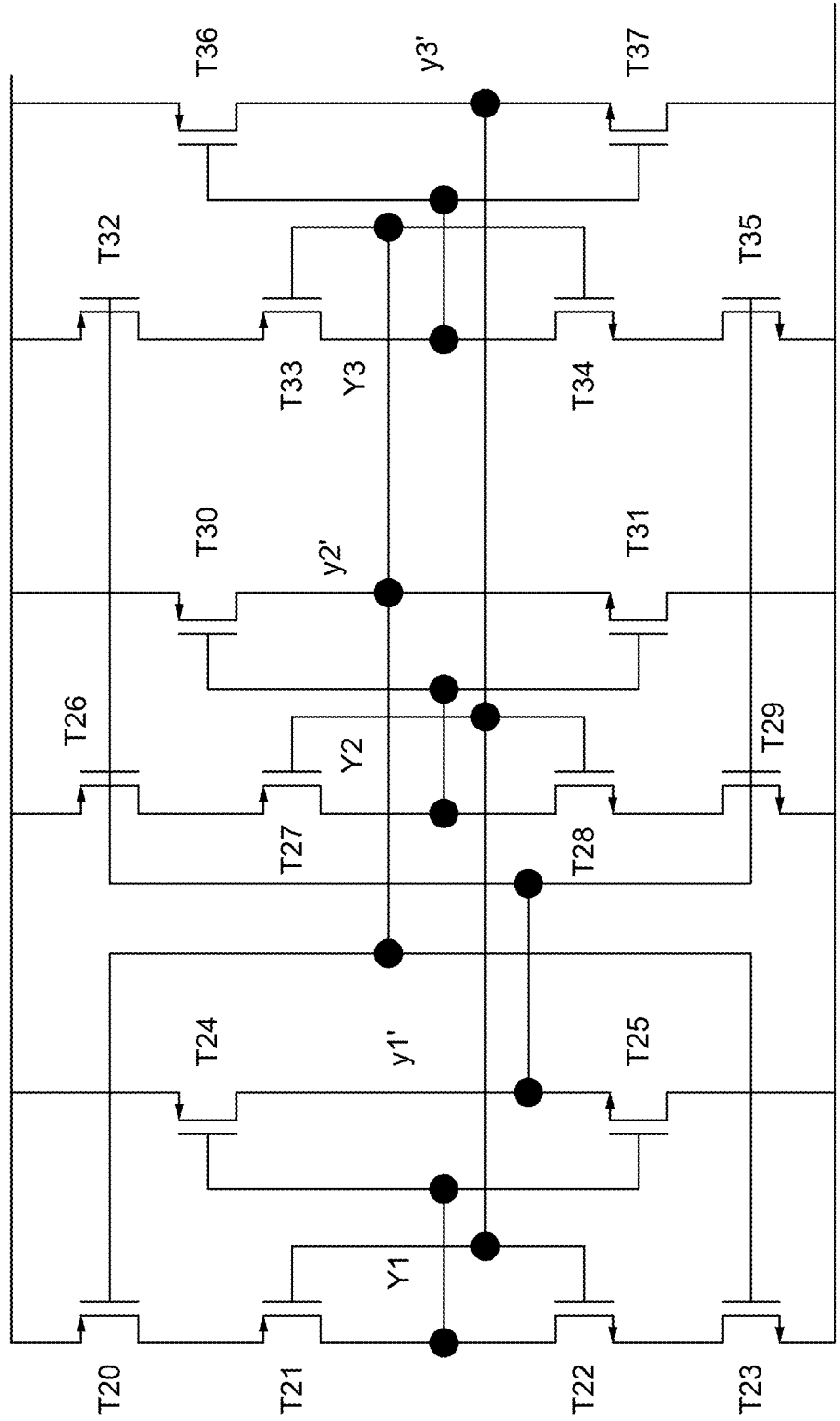
FIG. 5 shows a first representative SRL Latch Circuit of the prior art.
Figure 6:
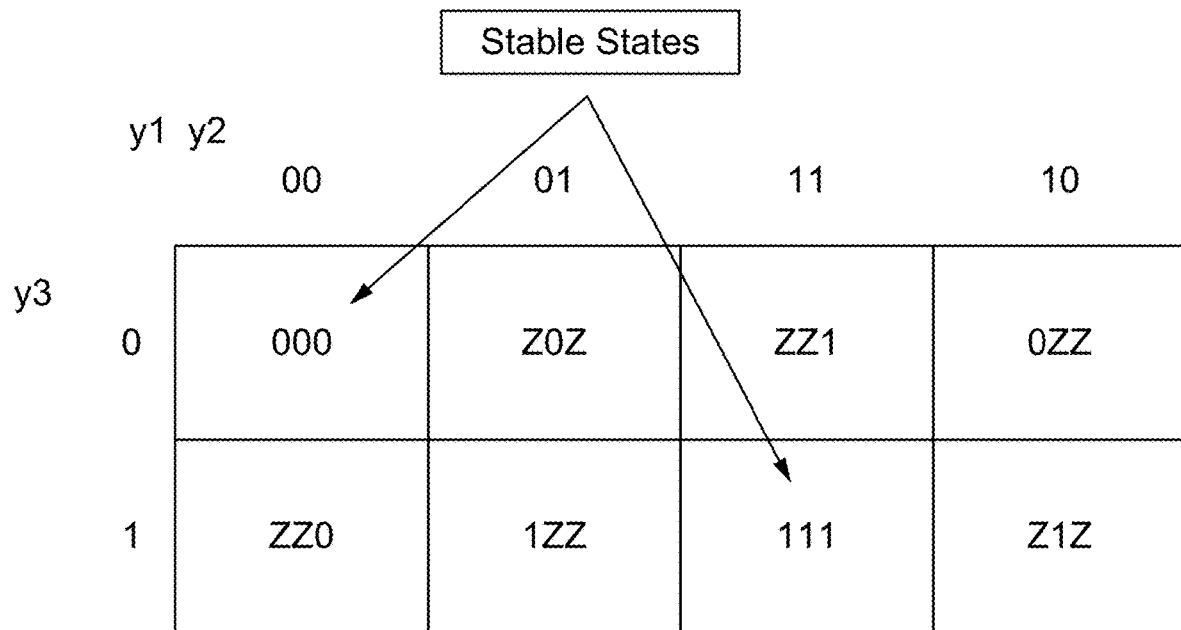
FIG. 6 shows a State Table for the SRL Latch Circuit of FIG. 5.
Figure 7:
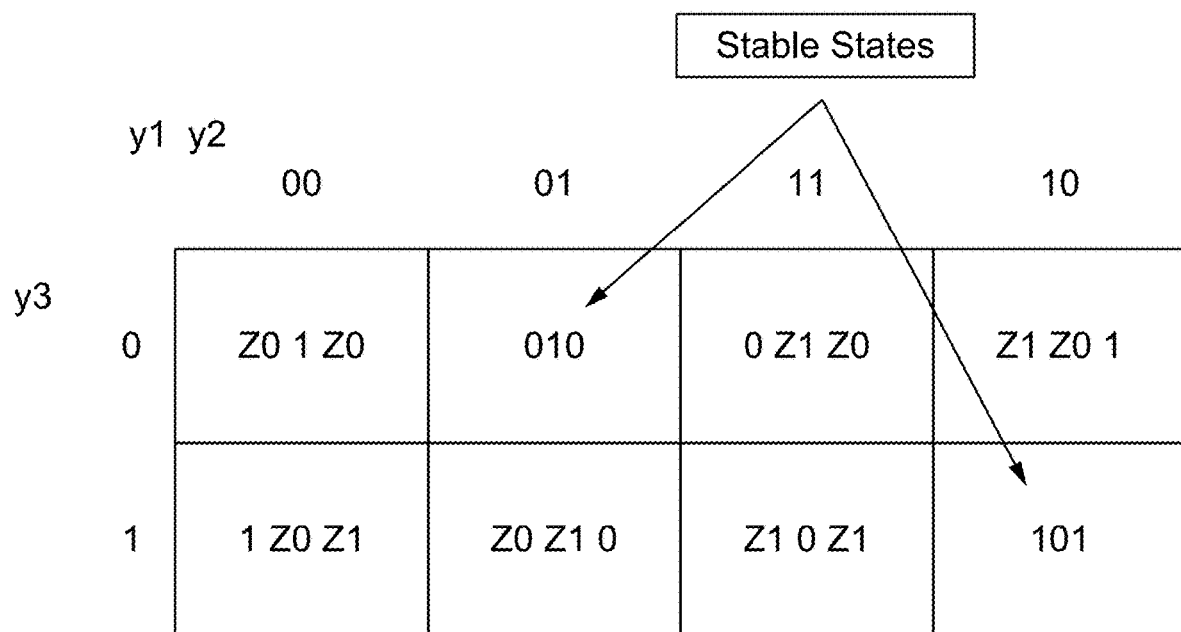
FIG. 7 shows a State Table for the SRL Latch Circuit of FIG. 8.
Figure 8:
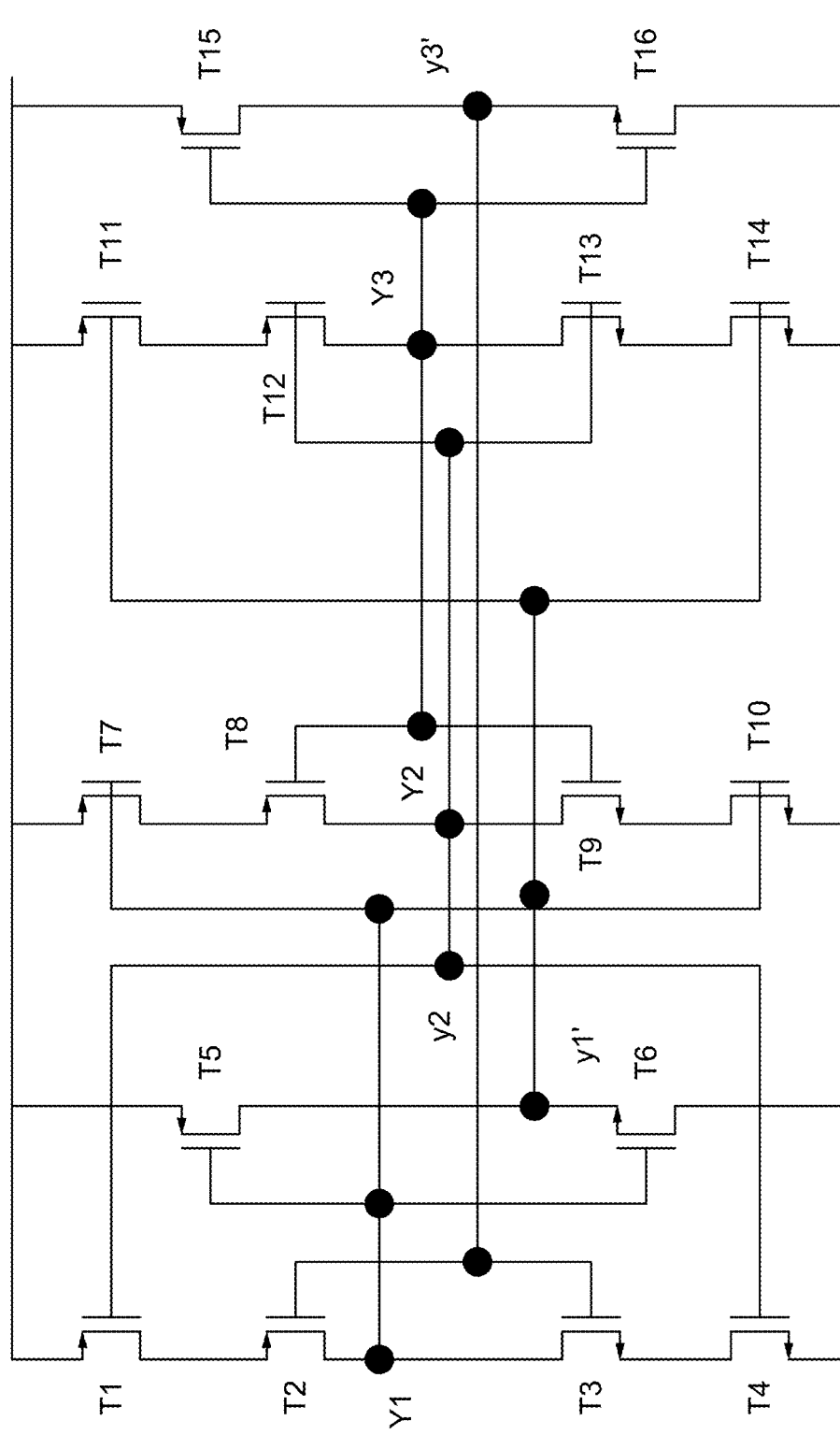
FIG. 8 shows a second representative SRL Latch Circuit Design of the prior art.
Figure 9:
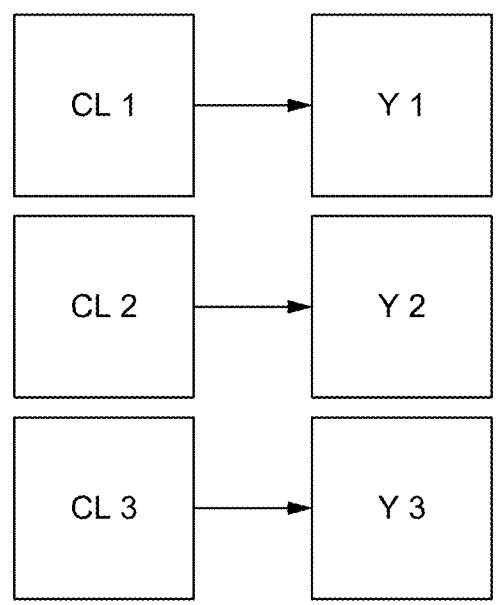
FIG. 9 shows a schematic illustrating Combinational Logic with more detail for the circuit of FIG. 4.
Figure 10:
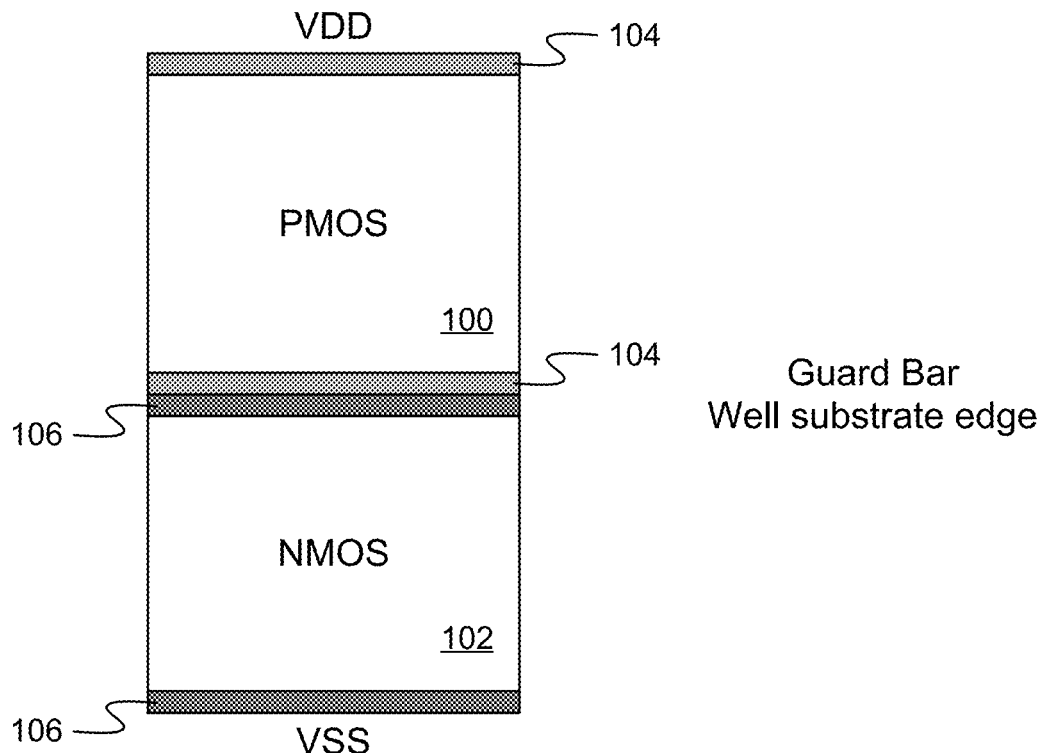
FIG. 10 shows Typical CMOS Structure.

CMOS standard cell layout typically consists of an area composed of NMOS transistors and another area composed of PMOS devices. The NMOS devices are coupled to VSS such that the NMOS transistors generate logic 0 values throughout the circuit, and PMOS devices are coupled to VDD such that the PMOS transistors generate logic 1 values. The boundary between the NMOS and PMOS devices has guard bar coupling the N well substrate to VSS and the P well substrate to VDD. FIG. 10 depicts the typical CMOS circuit structure. A PMOS device area 100 is formed adjacent an NMOS device area 102. A VDD bus 104 is formed adjacent the PMOS circuit 100. A VSS bus 106 is formed adjacent the NMOS circuit 102. Preferably, the VDD and VSS busses are formed of metal. The VDD and VSS busses also act as guard bar in the region between the PMOS circuit 100 and the NMOS circuit and depict the well/substrate tie downs and can be tied hard to VDD/VSS with continuous metal busses or more softly with intermittent contacts to VDD/VSS.

Figure 11:
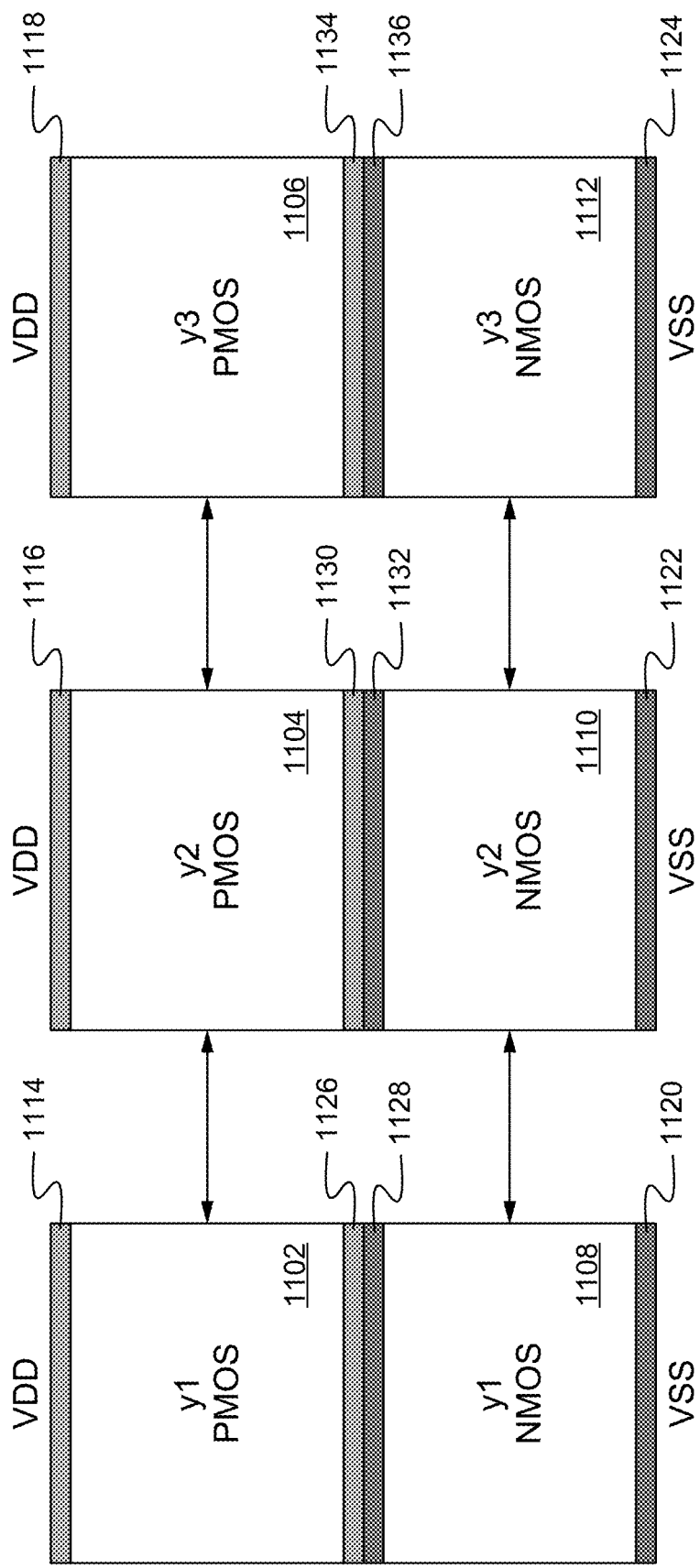
FIG. 11 shows a schematic of a graphical non layout view of SRL Latch Logic.

The SRL latch of FIG. 11 comprises three state variables y1, y2, y3. FIG. 11 depicts a graphical but not realistic layout view of the SRL latch. Each of the three state variable includes a PMOS region 1102, 1104 and 1106 and also an NMOS region 1108, 1110 and 1112. A VDD bus 1114 is adjacent the PMOS region 1102 away from the NMOS region 1108. A VDD bus 1116 is adjacent the PMOS region 1104 away from the NMOS region 1110. A VDD bus 1118 is adjacent the PMOS region 1106 away from the NMOS region 1112. A VSS bus 1120 is adjacent the NMOS region 1108 away from the PMOS region 1102. A VSS bus 1122 is adjacent the NMOS region 1110 away from the PMOS region 1104. A VSS bus 1124 is adjacent the NMOS region 1112 away from the PMOS region 1106. A guard bar is formed of a VDD bus 1126 adjacent the PMOS region 1102, and a VSS bus 1128 adjacent and between the VDD bus 1126 and the NMOS region 1108. A guard bar is formed of a VDD bus 1130 adjacent the PMOS region 1104, and a VSS bus 1132 adjacent and between the VDD bus 1139 and the NMOS region 1110. A guard bar is formed of a VDD bus 1134 adjacent the PMOS region 1106, and a VSS bus 1136 adjacent and between the VDD bus 1134 and the NMOS region 1112.

Figure 12:
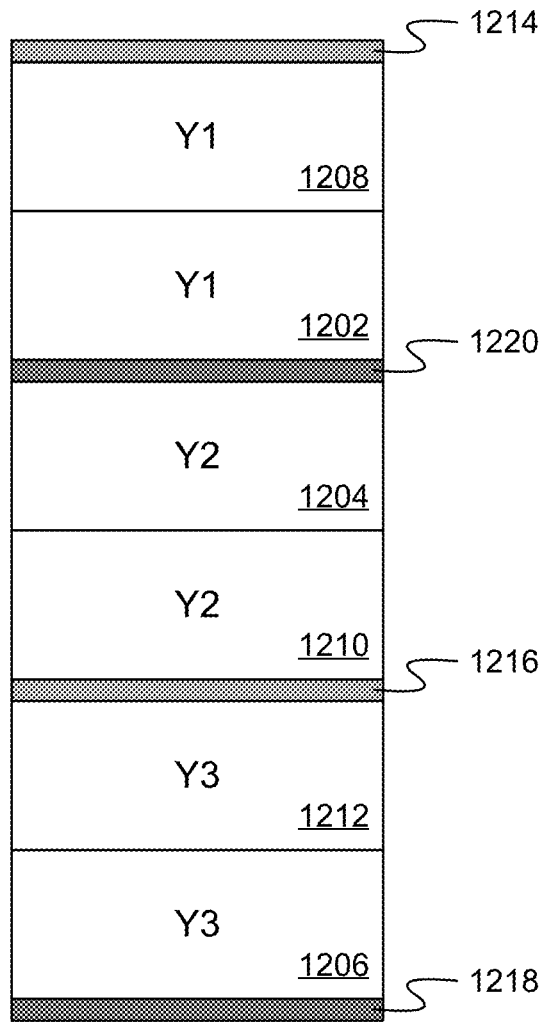
FIG. 12 shows a schematic graphical layout structure of SRL Latch Logic.

FIG. 12 depicts a better layout view of the SRL latch where one can share VSS and VDD between adjacent state variables of the SRL latch. Note, the guard bar denoting the well substrate edges is not shown in succeeding Figures to avoid obscuring the invention in extra details. The drawing shows three NMOS regions 1202, 1204 and 1206 and three PMOS regions 1208, 1210 and 1212. A first VDD bus 1214 is adjacent the PMOS region 1208. A second VDD bus 1216 is adjacent the other two PMOS regions 1210 and 1212. A first VSS bus 1218 is adjacent the NMOS region 1206. A second VSS bus 1220 is adjacent the other two NMOS regions 1202 and 1204.

However, there is a potential problem with this layout to realize an SRL latch. If the stable states (y1 y2 y3) in U.S. Pat. No. 8,081,010 for the SRL latch are 000 and 111, then in FIG. 12 the NMOS devices of Y1 and Y2 are adjacent and the PMOS devices of Y2 and Y3 are adjacent. As noted in the Background discussion, a single particle strike SEU can affect NMOS devices to produce a false 0, but not a false 1; likewise, an SEU can affect PMOS devices to produce a false 1, but not a false 0. Therefore, if the latch is in state 111, a single SEU can affect Y1 and Y2 to both produce false 0's forcing the circuit into state 001; internal feedback will force the circuit to state 000 and the latch has upset. Likewise, if the circuit is in state 000, a single SEU through the PMOS regions of Y2 and Y3 can force the circuit to state 011; internal feedback will force the circuit to state 111 producing an upset.

Figure 13:
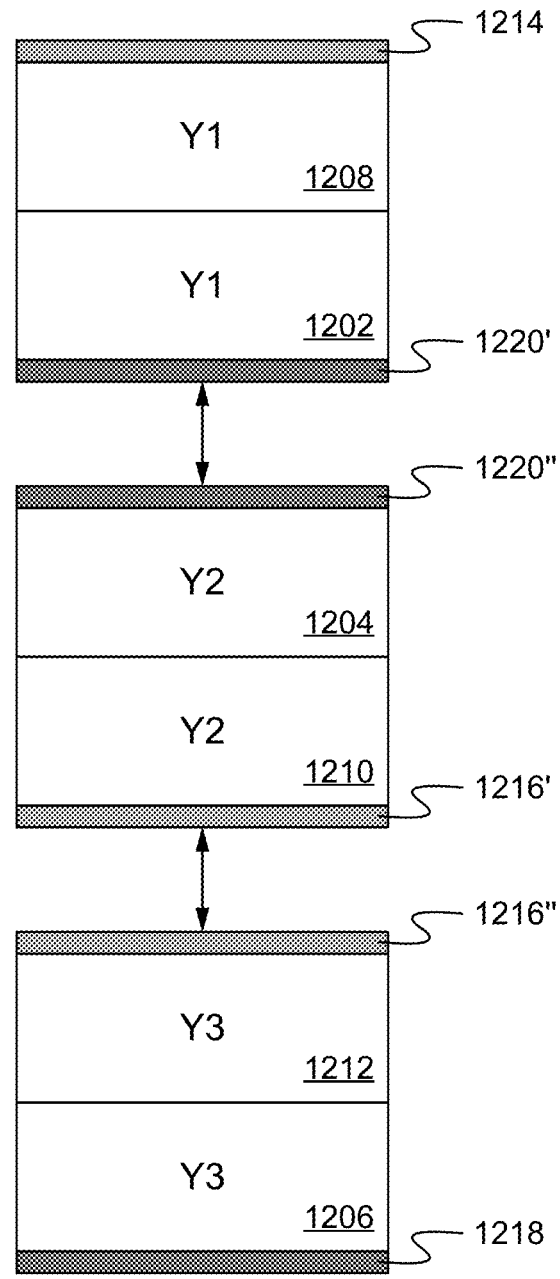
FIG. 13 show a schematic graphical layout structure of SRL Latch Logic of FIG. 12 with added separation to protect against SEU affecting two state variables.

In previous designs based on U.S. Pat. No. 8,081,010, to remedy this problem, it is better to introduce a separation between adjacent NMOS devices in Y1 and Y2 and between adjacent PMOS devices in Y2 and Y3 as shown in FIG. 13. The extra area includes the addition of one VSS and one VDD bus plus the separation distance. The element numbering of the common elements is the same in FIG. 13 as for FIG. 12. Note that the second VSS bus 1216 is split into two VDD buses 1216' and 1216". Likewise the second VSS bus 1220 is split into two VSS buses 1220' and 1220". A first gap 1222 is formed between the split second VSS buses 1216' and 1216". A second gap 1224 is formed between the split second VDD buses 1220' and 1220". The distance of the separation is a function of the doping profiles of a specific process. Higher doping concentrations will cause the electron hole pairs generated by the upsetting particle to be recombined more quickly (ie. reduce the lifetime of the generated charge).

If one uses the state assignment with states (y1 y2 y3) as 010 and 101, the layout requirements change dramatically. The layout of FIG. 12 can be used. This layout is SEU fault tolerant. Consider the layout depicted in FIG. 12 and the circuit is in state 010. In state 010, Y1 produces a 0 and Y2 produces a 1. If an SEU affects the adjacent NMOS circuits of Y1 and Y2 then only false 0's can result; however, Y1 is already 0 and therefore unaffected by the SEU. Only Y2 could be affected and forced to a 0 in which case the circuit temporarily assumes state 000. When the SEU dissipates, the circuit is forced back to 010 and the SEU is tolerated. If the circuit is in state 101 and the same SEU strike situation occurs, the circuit will temporarily assume state 001 where Y1 is affected but Y2 is not; again, after the SEU dissipates, the circuit will return to state 101 and the SEU is tolerated.

Consider the case where an SEU affects the adjacent PMOS areas of Y2 and Y3 in FIG. 12 and the circuit is in state 010. Only false 1's can occur in a PMOS region and only Y3 is forced to a wrong value 1; Y2 remains 1 and the circuit assumes state 011. Y2 is unaffected since PMOS devices only fail to produce a false logic 1. After the SEU is dissipated, the circuit will return to 010 and the SEU is tolerated. If the circuit is in state 101, only Y2 can be affected and the circuit assumes state 111. After the SEU is dissipated, Y2 will return to 0 and the circuit assume state 101 and the SEU is tolerated.

Figure 14:
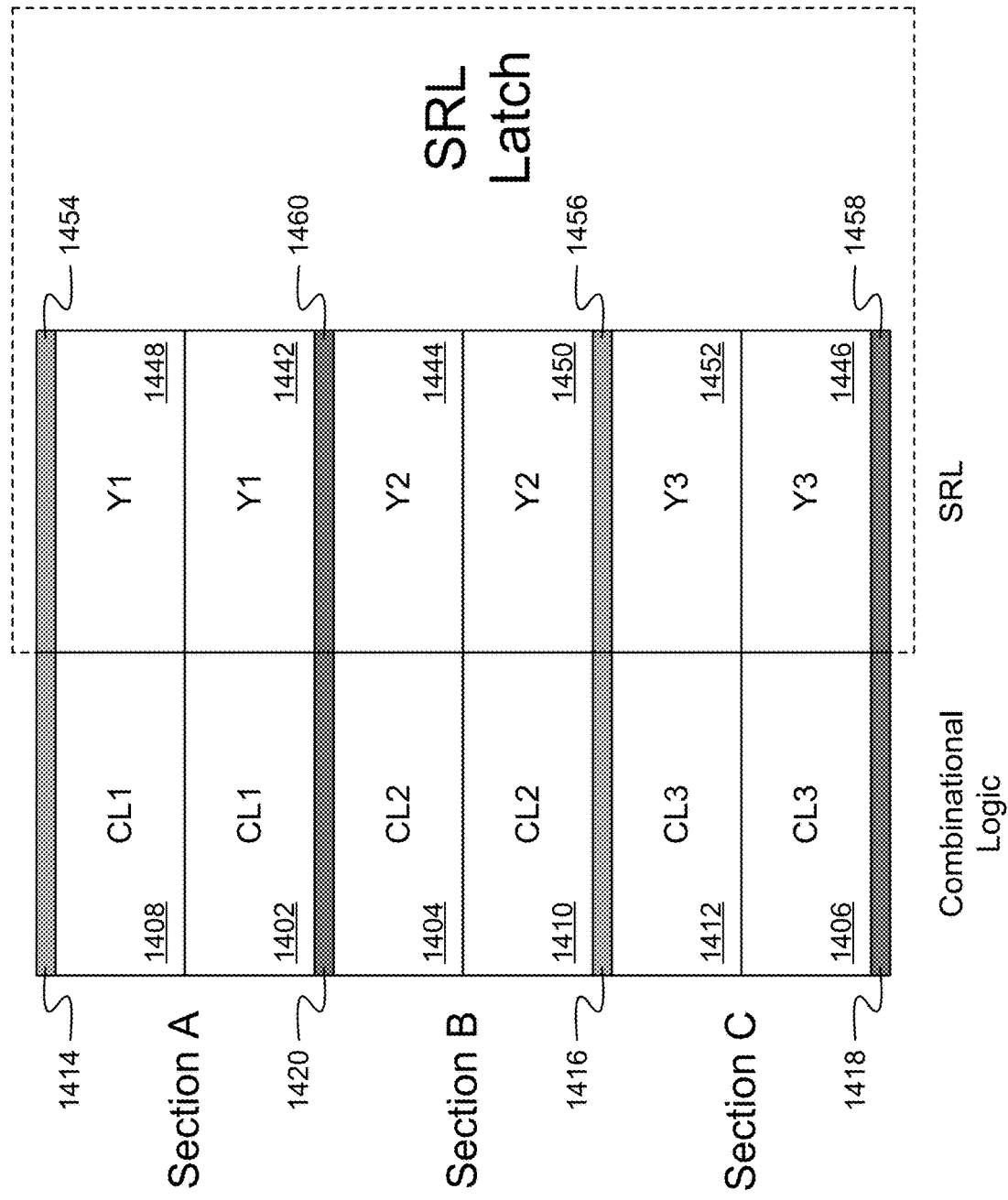
FIG. 14 shows a schematic with combinational logic with SRL layout together.

Normally combinational logic drives the SRL latch. The SRL latch has three inputs which are driven by the respective combinational logic, Sections A, B and C. FIG. 14 depicts a preferred embodiment in which the layout can be configured according to the teachings of FIG. 12. In particular, the combinational logic is formed of three NMOS regions 1402, 1404 and 1406 and three PMOS regions 1408, 1410 and 1412. A first VDD bus 1414 is adjacent the PMOS region 1408. A second VDD bus 1416 is adjacent the other two PMOS regions 1410 and 1412. A first VSS bus 1418 is adjacent the NMOS region 1406. A second VSS bus 1420 is adjacent the other two NMOS regions 1402 and 1404. The SRL Latch section is of three NMOS regions 1442, 1444 and 1446 and three PMOS regions 1448, 1450 and 1452. A first VDD bus 1454 is adjacent the PMOS region 1448. A second VDD bus 1456 is adjacent the other two PMOS regions 1450 and 1452. A first VSS bus 1458 is adjacent the NMOS region 1446. A second VSS bus 1460 is adjacent the other two NMOS regions 1442 and 1444. The two PMOS regions 1408 and 1448 can be formed of two separate wells but more preferably are formed in a single PMOS well. Similarly, the remaining regions shown horizontally adjacent in the drawing of FIG. 14 can be formed of two wells or a single well. Metal buses 1414 and 1454 can be one metal bus as can 1416 and 1456, 1420 and 1460, and also 1418, and 1458, respectively.

Three independent (no shared logic) combinational logic circuits are used to drive each SRL state variable (SRL inputs). Section B will produce the logical complement signal of Sections A and C. State variable y2 is the logical complement of y1 and y3 (SRL Design 2 above) such that the driven states are 101 or 010. Since it is independent if an SEU strikes either CLi or Yi or both, all Sections (A, B and C) are SEU tolerant in the same manner the SRL latch described above is SEU tolerant.

Combinational Logic Design Considerations

Care must be given to the design of the combinational logic. A first reaction is to design two identical circuits except place an inverter at the output of one of the circuits to generate F and F'. Consider CL1 and CL2 which are supposed to generate complementary outputs with the NMOS regions adjacent as depicted in FIG. 14. Further assume that CL2 is identical to CL1 except there is an inverter at the output of CL2. Let CL1 CL2=1 0. Logic internal to CL1 and CL2 will have the same values which produce an output=1 with CL2 producing a 0 due to the output inverter. If an SEU strikes both NMOS circuits, a false 0 will be generated internal to both circuits yielding an output 01 instead of the correct 10 or the correctable 00, which will result in a failure.

Figure 22:
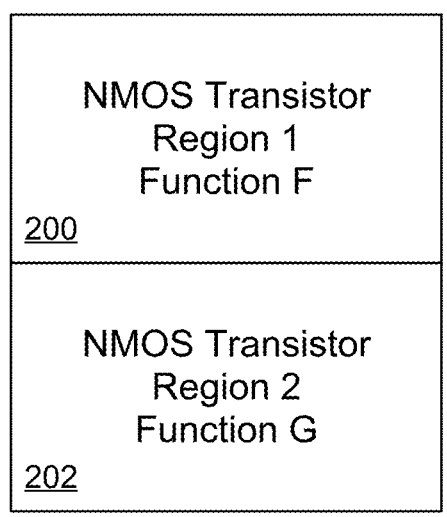
FIG. 22 shows a schematic representation of adjacent regions of NMOS transistors that implement F and G.

Let the two NMOS regions 200 and 202 in FIG. 22 depict NMOS transistor regions of adjacent regions that implement an uncomplemented function F and a complemented function G which is F'.

Definition 1: A Transient 1 (0) Unidirectional Fault region exists when the electronics in the region can only produce a false 1 (0) value.

A region consisting only of PMOS transistors would be a Transient 1 Unidirectional Fault and a region consisting of only NMOS transistors would be a Transient 0 Unidirectional Fault when the fault is an SEU.

Adjacent NMOS regions of logic functions F and G tolerate Transient 1 or 0 Unidirectional faults if G=F' and F and G contain no logic inversions or if logic inversions are present the electronics creating such inversions are SEU tolerant such that a false 1 cannot occur. Since Transient 1 or 0 Unidirectional Faults are SEUs, let the following discussion use SEU faults as these transient faults.

Consider the situation where an SEU impacts both F and G in FIG. 22. If F and G have the same value 1 anywhere in the region which the SEU can impact, then both F and G can both be upset. This includes the situation where F=1 and G=0, but there is inverted logic within G which presents a 1 to internal circuits; upon an upset within G that forces a 1 to a 0 which gets inverted to transition G to a false 1. If F and G are realized with no inverters, including logic inversion in gates such as NAND and NOR, and further if F and G are complements, then a single SEU cannot upset both F and G. With alternating logic, FG will be 01 or 10; an SEU will force a state of 00 if the correct state FG=01. Likewise, if the correct state is 10, an SEU can cause an output of 00. Therefore, an SEU will force the output from 01 (10) to 00 but never 10 (01). For example, if F G=0 1, then only G can be upset to a 1, but F is unaffected; if FG=1 0, then only F is affected. The following SRL latch will correct the single fault and the SEU fault is tolerated.

Finally, if logic inversions are present (for example in a NAND), and the circuitry that performs the inversion is SEU hard (i.e. a false 1 cannot occur), then the circuitry is SEU tolerant since there are no false 1's possible.

It should be clear that the same applies for adjacent PMOS regions. Further since an SEU is a Transient 1 or 0 Unidirectional fault, applies to SEU fault tolerance. Further the structure shown in FIG. 14 is SEU tolerant when alternating logic is utilized and the NMOS or PMOS regions are adjacent as depicted in FIG. 14.

There are at least five logic structures which will produce combinational logic that meet the conditions of the above and produce outputs without internal logic inversion.
1. AND-OR and OR-AND logic circuits which realize circuits with AND and OR gates, not NAND or NOR gates or any other logic form with inverters.
2. Pass Transistor Logic
3. Complex CMOS gates
4. Multiplexor gate logic
5. Logic gates that perform logic inversions are designed through proper electronics to be SEU hard, not allowing a false 1 to occur in NMOS circuits or a false 0 to occur in PMOS circuits.

These five logic structures can be formed without logic inversion and hence meet the conditions above.

Consider the simple Karnaugh map (K-Map) shown in FIG. 15.

The typical way to realize function F to produce a minimal sum-of-products is to cover the prime implicants as shown in FIG. 16. F=y1'y3'+y1y2' which can be realized with AND OR logic.

F' is realized in FIG. 17, which is the complement of F formed in FIG. 15. F' can be realized as F'=y1y2+y1'y3 and F' can be realized with AND OR logic the same as the circuit of FIG. 16 was produced.

This result can also be obtained using Pass Transistor Logic, F=X'(Z')+X(Y). If it is desired to pass only a 0 or a 1 instead of a variable, the Pass Transistor Logic equation becomes F=y1'y3'(1)+y1y2'(1)+y1'y3(0)+y1y2(0). The complemented function F'=y1'y3'(0)+y1y2'(0)+y1'y3(1)+y1y2(1).

An alternate embodiment is to implement the combinational logic as a Complex CMOS gate. Following is such an implementation of the design of K-Map in FIG. 15. The Complex CMOS gate design equation for F is shown in FIG. 18. Similarly, the Complex CMOS gate design equation for F' is shown in FIG. 19.

Figure 20:
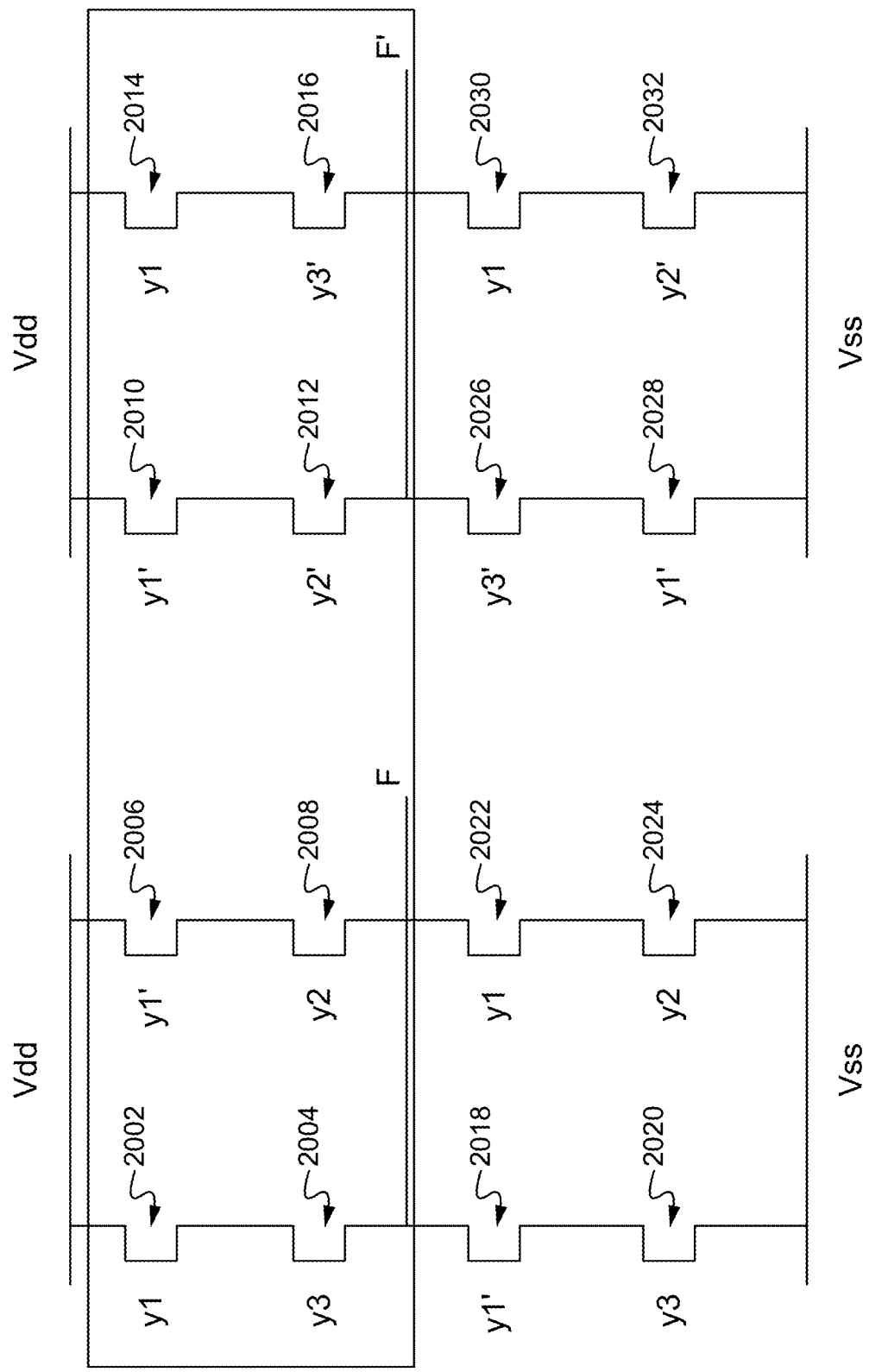
FIG. 20 shows a partial circuit diagram for a Complex CMOS depiction for the realization of F and F' respectively.

The Complex CMOS electronic depiction is shown in FIG. 20. The number of transistors in FIG. 18 can be reduced.

The connection diagram is not shown as it is understood that external variables (coming from a set of SRL latches) yi, i={1,2,3} are connected. The upper 8 transistors 2002, 2004, 2006, 2008, 2010, 2012, 2014 and 2016 are PMOS devices; the lower 8 transistors 2018, 2020, 2022, 2024, 2026, 2028, 2030 and 2032 are NMOS devices. The transistors 2002, 2004, 2006, 2008, 2018, 2020, 2022 and 2024 are coupled to form F according to the state of their respective inputs. The transistors 2010, 2012, 2014, 2016, 2026, 2028, 2030 and 2032 are coupled to form F' according to the state of their respective inputs.

The desired action for SEU tolerance for the Complex Gate in FIG. 20 is described next. Consider the case where F=1, and F'=0. F=1 means there is a path from VDD through PMOS devices to the output F; the NMOS paths of F are OFF. In a similar manner, there is a path through the NMOS devices in the F' network passing a 0 to F'; the PMOS paths of F' are OFF.

Let these two designs be structured as depicted in FIG. 14 with the NMOS devices adjacent as Y1 and Y2; PMOS regions that are adjacent are for Y2 and Y3. The question to be addressed is whether a single SEU passing through the NMOS regions of both F and F' create the possibility for F F' to transition from producing correct 1 0 value to incorrect 0 1 value; that is both F F' change state as a result of a single SEU."

Let F F'=1 0. The SEU passing through the NMOS region of F can induce a false 0 (NMOS devices produce false 0's, not false 1's.) However, since F' is producing a correct 0, an SEU passing through the NMOS region of F' cannot force a false 1 output. Therefore, an SEU passing through the NMOS regions of F and F' will yield a 0 0 output, but not a 0 1 value. The same result occurs for the case where F F'=0 1; a single SEU would only change the F' output from a 1 to 0, but not affect the output of F.

If the PMOS regions were adjacent as depicted in FIG. 14 instead of the NMOS regions, the result would be similar except that instead of producing a false 0 value on F or F', a false 1 value on either F or F' would result, but not both.

The structure depicted in FIG. 14 will function such that SEU's are tolerated in the manner described because only one of two adjacent "slices" would ever temporarily produce a false value. The SRL latch will correct one input in error.

FIG. 20 also depicts the pass logic realization of this function with the same number of transistors and interconnect when 0's and 1's are passed. Therefore, pass logic circuits are SEU tolerant.

Figure 21:
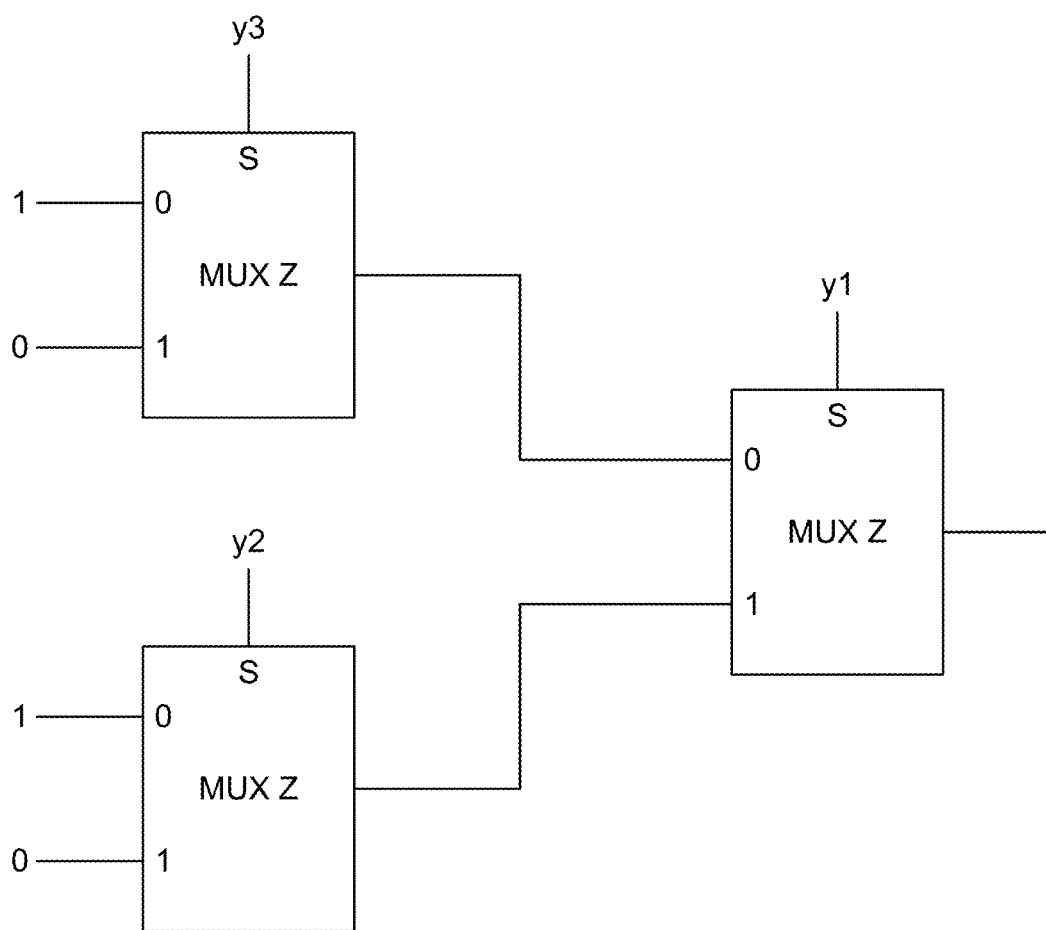
FIG. 21 shows a circuit schematic of a multiplexor solution to realize function F.

The MUX solution for this circuit is shown in FIG. 21. The inputs 0 and 1 can be VSS and VDD inputs respectively.

A similar multiplexor solution exists for F'; actually, the same circuit except all the 0 and 1 inputs are inverted. Each MUX can be implemented as NMOS transistors or PMOS transistors or a combination of both NMOS and PMOS transistors which would produce higher quality 0 and 1 voltage levels. Regardless, the NMOS or PMOS transistor regions can be abutted to produce the desired adjacent alternating logic circuits and be SEU tolerant.

Finally addressing the last means (item 5) to produce SEU tolerant circuits, transistors can be made large enough to be immune to an SEU, therefore circuits constructed with proper sized transistors are SEU tolerant. Therefore, if a logic inversion is needed and the designer is willing to accept a larger circuit to create SEU tolerance in the logic inversion circuitry, then the presence of such a circuit is permitted.

Definition 2: A Whitaker-Maki (WM) SEU tolerant structure consists of
1. Three combinational structures that possess a layout structure consisting of combinational logic and storage elements as depicted in FIG. 14;
2. Alternating logic is employed where the three structures pass states 010 and 101;
3. Combinational logic with adjacent NMOS (or PMOS) regions of logic functions F and G under two conditions:
   a. F=G' and F and G contain no logic inversions in the combinational logic or
   b. The conditions of (a) are true except there are logic inversion gates all of which are SEU hard by design.
4. The storage cells (latches or flip-flops) are self restoring and correct single input failures. The preferred embodiment of a WM SEU tolerant structure implements the combinational logic with one of a Complex CMOS gate, pass transistor, or Multiplexor realization where there are no logic inversions; if a logic inversion is desired, then the circuitry that implements the logic inversion must be SEU hard. The self restoring cells should be SRL latches with the state assignment 010 and 101 with a layout structure depicted in FIG. 12.

The combinational logic in FIG. 14 depicts the layout configuration to interface combinational logic and the SRL latch. This can be a viable approach in general but there is latitude in placing components of combinational logic as long as the conditions of the WM SEU tolerant structure are met. For example, logic components that compose Section A, B and C can be shifted around as long as adjacent NMOS regions (or PMOS regions) of CLi and CLj, where i and j are components of alternating logic meet condition 3. Therefore, there is flexibility for the designer in an actual layout.

Applications Of Proposed Discovery

Let CLi and Yi denote combinational logic and SRL cells in FIG. 14 respectively. Implementing a synthesis library using FIG. 14 can be accomplished by having combinational logic cells and SRL state variable cells configured as shown in FIG. 14. All cells would have the same height dimension with power, ground and well ties that match.

Let Dmin represented the minimum distance sensitive nodes can be placed. An SEU strike at a distance greater than Dmin does not upset nodes. If one used a layout similar to FIG. 13, the distance between CLi cells and Yi cells would have to meet the Dmin constraint. In comparison, legacy Triple Modular Redundancy (TMR) must obey the Dmin layout constraint producing much less density than the SRL approach outlined herein.

The WM structure concept can be generalized to realize any logic structure that does not include SRL latches. A pure combinational logic circuit meeting the conditions of Definition 2 (minus the latches) is SEU tolerant.

Any logic circuit with combinational logic that meets the conditions of the WM structure with single input error correction and self restoring latches (flip flops) is SEU tolerant, even if a self restoring function is different than found in the use of an SRL latch. For example, a TMR circuit could be created that meet the conditions of a WM structure. In TMR, there are three sections of logic; let them be called S2, S2 and S3 and assume they meet the combinational logic conditions of the WM structure. To employ an alternating logic scheme, S1 S2 S3 must produce codes 010 and 101 as the fault free states. This means S2 must produce the logical complement of S1 and S3 without internal inversion. In TMR, the self-restoring and single input error correction aspect is achieved with voters; embedded voters would be required to "vote" using values 010 and 101 as correct states; further the layouts for the latches and voters must meet the WM conditions. The resulting TMR circuit would have excellent density characteristics compared to legacy TMR SEU tolerant circuits, but still would require more transistors than preferred WM approach with SRL latches described herein.

What is claimed is:

1. A Single Event Upset Triple Modular Redundancy (TMR) tolerant circuit logic structure formed of three NMOS and PMOS structures having a first circuit with a first NMOS structure adjacent a first PMOS structure to form a first logic section which includes a first 3-input voter circuit and a first flip-flop circuit, a second circuit with a second NMOS structure adjacent a second PMOS structure to form a second logic section which includes a second 3-input voter circuit and a second flip-flop circuit wherein the first and second NMOS structures are adjacent to one another, and a third circuit with a third NMOS structure adjacent to a third PMOS structure to form a third logic section which includes a third 3-input voter circuit and a third flip-flop circuit wherein the second and third PMOS structures are adjacent one another, wherein the Single Event Upset TMR tolerant circuit logic structure is adapted to have alternating logic outputs 010 and 101 with voter circuits in each logic circuit voting on 010 and 101 as correct values to correct errors, further wherein outputs of the first and third logic sections are the same and the output of the second logic is the logical complement of the outputs of the first and third logic sections.

2. The Single Event Upset TMR tolerant circuit logic structure according to claim 1 wherein adjacent NMOS regions or adjacent PMOS regions contain no logic inversions in a combinational logic of the 3-input voter circuit.

3. The Single Event Upset TMR tolerant circuit logic structure according to claim 1 wherein adjacent NMOS regions or adjacent PMOS regions contain gates that generate and propagate logic inversions in a combinational logic of the 3-input voter circuit where all gates are SEU hard by design.

4. The Single Event Upset TMR tolerant circuit logic structure according to claim 1 selectively realized using one of a Complex CMOS gate, pass transistor logic, Multiplexor logic, AND-OR logic or OR-AND logic to realize combinational logic of the 3-input voter circuit.

5. The Single Event Upset TMR tolerant circuit logic structure according to claim 1 wherein the latch provides SEU tolerance.

* * * * *

UNITED STATES PATENT AND TRADEMARK OFFICE
CERTIFICATE OF CORRECTION

| | |
|---|---|
| PATENT NO. | : 11,552,079 B2 |
| APPLICATION NO. | : 17/321070 |
| DATED | : January 10, 2023 |
| INVENTOR(S) | : Sterling Whitaker et al. |

It is certified that error appears in the above-identified patent and that said Letters Patent is hereby corrected as shown below:

In the Specification

At Column 3, Line 62, please replace the equation "$Y0 = y1y3(0) + y1'$" with -- $Y0 = y1y3(0) + y1'(1)$ --.

At Column 4, Line 19, please replace "$y1'$" with -- $yi'$ --.

Signed and Sealed this
Third Day of October, 2023

Katherine Kelly Vidal
*Director of the United States Patent and Trademark Office*